US006861911B2

(12) United States Patent
Hwang et al.

(10) Patent No.: US 6,861,911 B2
(45) Date of Patent: Mar. 1, 2005

(54) SELF-REGULATING VOLTAGE CONTROLLED OSCILLATOR

(75) Inventors: In-Chul Hwang, Seoul (KR); Sung-Mo Kang, Santa Cruz, CA (US); Bo-Eun Kim, Yongin-si (KR)

(73) Assignee: Integrant Technologies, Inc., Kyeongki-Do (KR)

( * ) Notice: Subject to any disclaimer, the term of this patent is extended or adjusted under 35 U.S.C. 154(b) by 97 days.

(21) Appl. No.: 10/357,476

(22) Filed: Feb. 4, 2003

(65) Prior Publication Data

US 2003/0218510 A1 Nov. 27, 2003

(30) Foreign Application Priority Data

May 27, 2002 (KR) .................................. 10-2002-0029340

(51) Int. Cl.[7] .............................................. H03B 27/00
(52) U.S. Cl. ........................ 331/57; 331/34; 331/177 R
(58) Field of Search ........................ 331/57, 34, 177 R; 327/57

(56) References Cited

U.S. PATENT DOCUMENTS

| | | | | |
|---|---|---|---|---|
| 6,304,149 B1 | * | 10/2001 | Kim | 331/57 |
| 6,329,849 B1 | * | 12/2001 | Czarnul et al. | 327/103 |
| 6,462,623 B1 | * | 10/2002 | Horan et al. | 331/17 |
| 2003/0034805 A1 | * | 2/2003 | Green | 327/57 |
| 2003/0227333 A1 | * | 12/2003 | Schmitt et al. | 331/57 |

* cited by examiner

Primary Examiner—Robert Pascal
Assistant Examiner—Joseph Chang
(74) Attorney, Agent, or Firm—Shinjyu Global IP Counselors, LLP (57) ABSTRACT

The present invention relates to the improvement of a phase noise characteristics of supply voltage in VCO. The delay in delay cells may be controlled to use the resistor of a transmission gate instead of a tail current. That is, the delay of cells is controlled by applying the overdrive voltage in transmission gate. And the self-regulating may be possible to composing a feedback inside the delay cells.

3 Claims, 13 Drawing Sheets

SELF-REGULATING VOLTAGE CONTROLLED OSCILLATOR

TECHNICAL FIELD

The present invention relates to a voltage controlled oscillator, and more particularly, to a self regulating-voltage controlled oscillator (SR-VCO) for the improvement of phase noise characteristics of power source voltage.

BACKGROUND OF THE INVENTION

An adjacent property between communication channels is high for the benefit of efficient using of a frequency spectrum in wireless communication nowadays. Accordingly, it is very important meaning to generating a clock and synthesizing a frequency.

A voltage controlled oscillator (VCO) is applied to the important components of phase lock loop (PLL) or frequency synthesizer. A voltage controlled oscillator (VCO) means the oscillator controlled frequency by voltage.

In the prior arts, LC-Tank oscillator is generally used for generating a clock and playing a voltage controlled oscillator. But the LC-Tank oscillator has low tuning range and high dependence on quality factor of phase noise in inductor. So, it is required to the separate process for abating phase noise. A ring oscillator, that it is high tuning range rather than the LC-Tank oscillator and may be integrated in CMOS process without a separate process, is generally used.

Figure 1A:
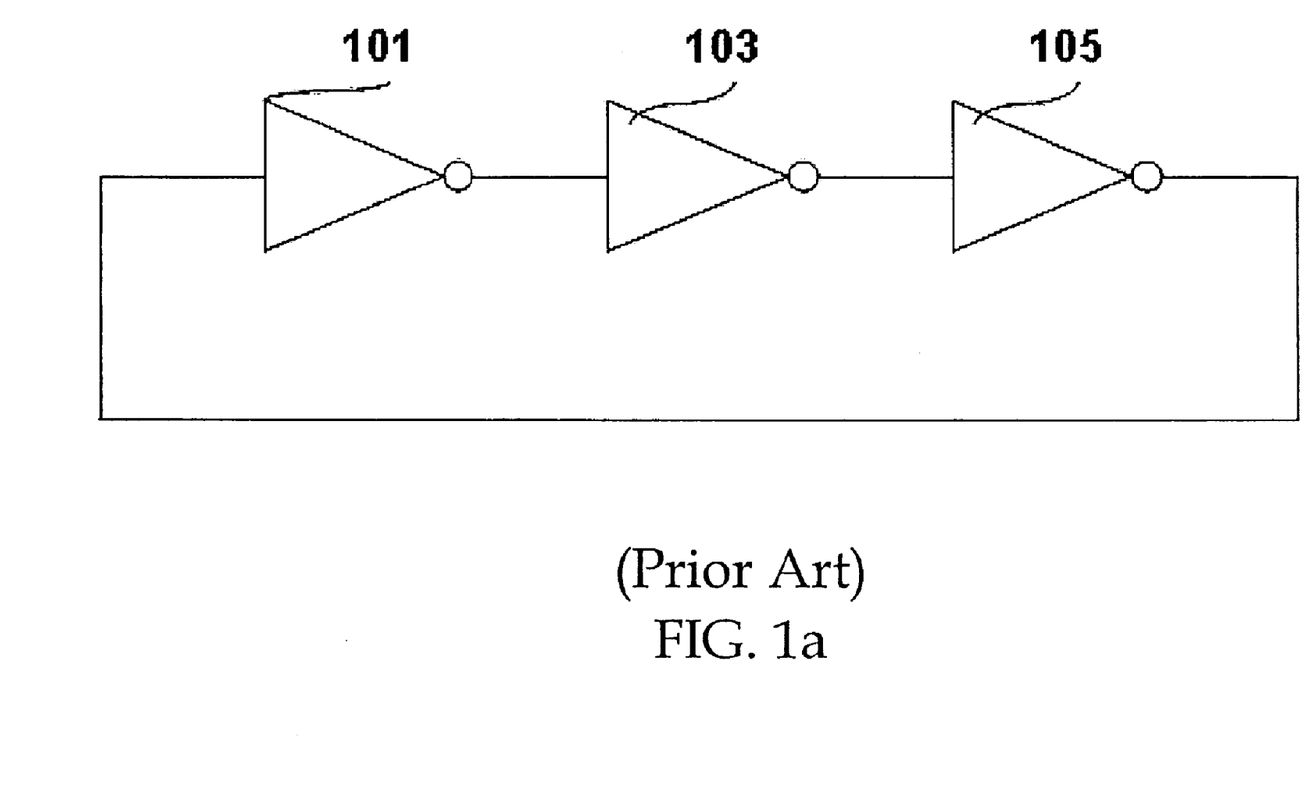
FIG. 1a shows a circuit diagram of a conventional ring oscillator.

FIG. 1a shows a circuit diagram of a conventional ring oscillator. The conventional ring oscillator is configured to a cardinal number of delay cells connected parallel with one another.

Figure 1B:
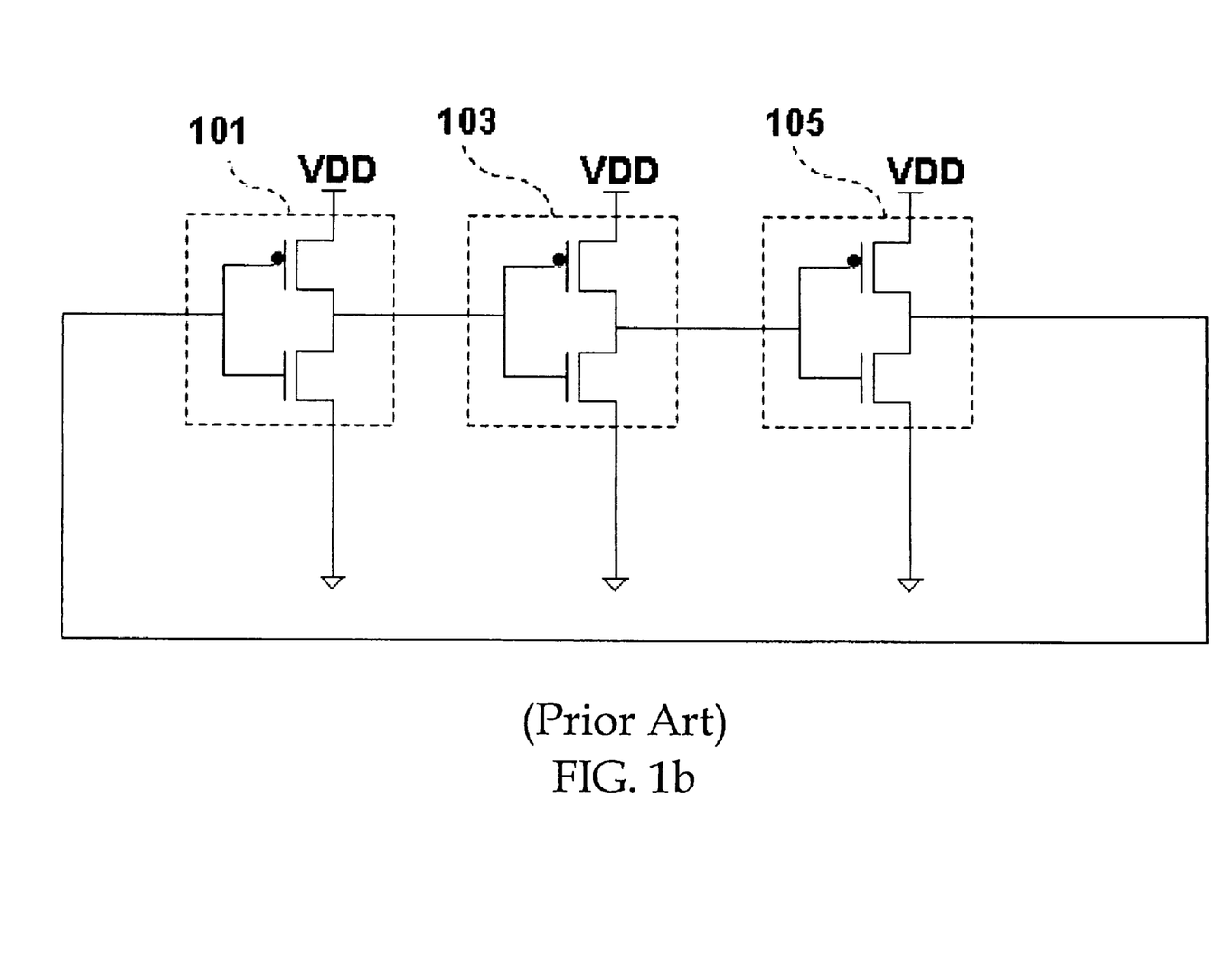

Generally each delay cells configuring a ring oscillator is embodied to an inverter circuit. FIG. 1b shows a circuit diagram of each delay cells configured to an inverter, in the ring oscillator showed in FIG. 1a.

By the circuit showed in FIG. 1b, first inverter 101 outputs power source voltage VDD or ground voltage GND according to the status of electrical potential. The output of first inverter 101 is inputted to second inverter 103 connected with first inverter 101 in series. Second inverter 103 outputs the voltage reversed to an input signal. The output of second inverter 103 is reversed by third inverter 105, and applied to the input stage of first inverter 101. If cardinal numbers of inverters are connected in series to have ring type connection, then, a clock signal having uniform frequency is acquired from an output of one of the inverters.

The conventional ring oscillator as mentioned above, it raises a serious problem of phase noise. So that the study for making up for the problem of the phase noise raised the ring oscillator, and differential delay cells are developed to the result of the study. Differential delay cells are superior to single-ended cells in noise characteristics, because their tail current that determines the delay is insensitive to the common-mode voltage variation. However, non-idealities of the circuit due to non-linearlities of load transistor and finite output impedance of tail current source prevent conventional delay cells from achieving good supply noise rejection. Moreover, considering the effect that 1/f noise of tail current is up-conversion, the phase noise performance of the differential delay cells may be worse than that of single-ended delay cells.

For solving above problem, delay cells not having the tail current source are developed in prior arts. These delay cells are solved above problem caused by the tail current, but it is raised the common-mode sensitivity problem of fully saturated VCO in case of using delay cells not having tail current, that is, it can not provide enough immunity to common-mode noise.

SUMMARY OF THE INVENTION

Therefore, it is an object of the present invention to provide a self-regulating voltage controlled oscillator, which is capable of overcoming above drawbacks accompanying the conventional art. Above and other objects can be achieved by combinations described in the independent claims. The dependent claims define further advantageous and exemplary combinations of the present invention.

To solve above problems, it is a first object of the present invention to provide a self-regulating voltage controlled oscillator for the improvement of noise characteristics of power source voltage.

It is a second object of the present invention to provide a self-regulating voltage controlled oscillator for improvement of a phase noise characteristics of power source voltage by controlling the delay using the resistor of transmission gate in delay cells instead of tail current source.

It is a third object of the present invention to provide a self-regulating voltage controlled oscillator that it is possible to self-regulate by composing a feedback in delay cells.

According to achieve above object, a self-regulating voltage controlled oscillator using second type transistor which has first, second and third terminals, wherein current flowing from the first terminal to the second terminal is in proportion to voltage between the first and third terminals, comprises: (a) first and second transistors of the second type, wherein the first terminals are connected to each other; (b) first and second transmission gate, each having an input, first and second control, and output terminals, respectively, wherein each of the input terminals is connected to each of the second terminals of the first and second transistors, respectively, and each of the second control and input terminals of the first transmission gate is connected to each of the input and second terminals of the second transmission gate; and (c) a latch having first and second output terminals, each of which is connected to each of output terminals of the first and second transmission gates, respectively, and first and second input terminals.

A self-regulating voltage controlled oscillator further using first type transistor which has first, second and third terminals, wherein current flowing from the second terminal to the first terminal is in proportion to voltage between the second and third terminals, wherein each of the first and second transmission gates comprises first and second type transistors, the first terminal of the first type transistor and the second terminal of the second type transistor is connected to each other to form the input terminal of the transmission gates, the second terminal of the first type transistor and the first terminal of the second type transistor is connected to each other to form the output terminal of the transmission gates, the third terminal of the first type transistor forms the first control terminal, and the third terminal of the second type transistor forms the second control terminal.

A self-regulating voltage controlled oscillator, wherein the latch comprises, first and second transistors of the first type which are connected to each other in parallel, such that, the first terminals of the first and second transistors are connected to each other to form the first output terminal, the second terminals of the first and second transistors are connected to each other, and the third terminal of the first transistor forms the first control terminal of the latch, third and fourth transistors of the first type which are connected to each other in parallel, such that, the first terminals of the third and fourth transistors are connected to each other to form the second output terminal, the second terminals of the third and fourth transistors are connected to each other, and the third terminal of the fourth transistor forms the second control terminal of the latch, and the third terminal of the second transistor is connected to the connection of the first terminal of the third and fourth transistors, and the third terminal of the third transistor is connected to the connection of the first terminals of the first and second transistors.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1b shows a circuit diagram that each delay cell is composed to inverters in the ring oscillator showed FIG. 1a.

DETAILED DESCRIPTION

The invention will now be described based on the preferred embodiments, which do not intend to limit the scope of the present invention, but exemplify the invention. All of the features and the combinations thereof described in the embodiment are not necessarily essential to the invention.

Figure 2:
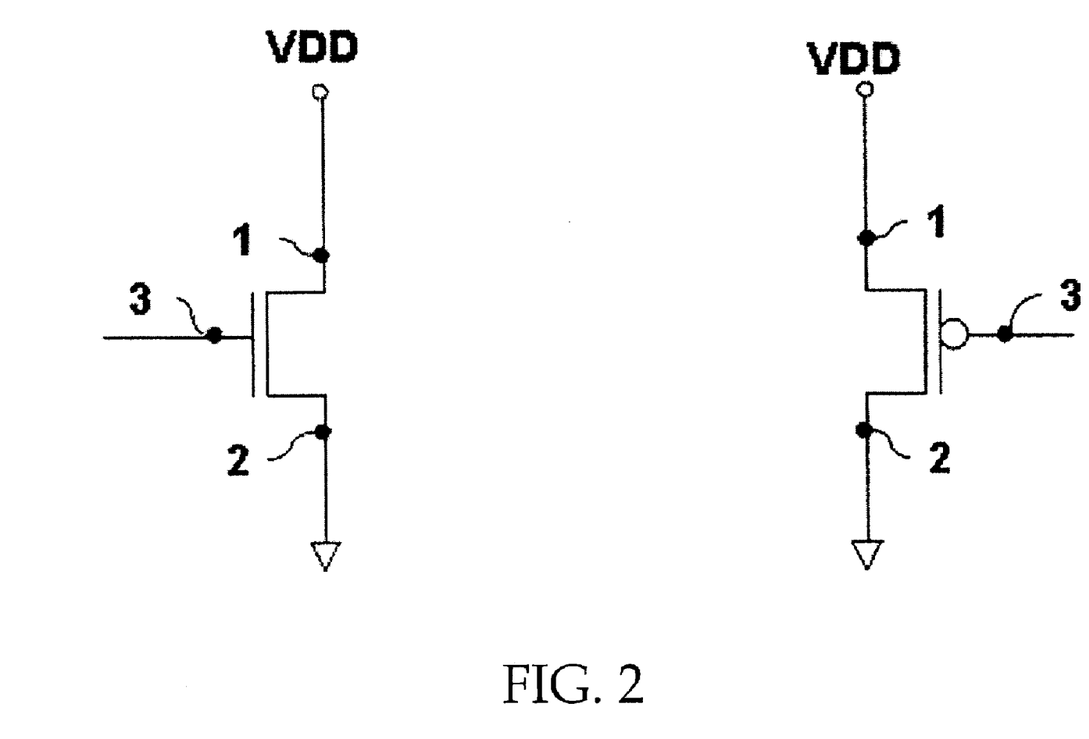
FIG. 2 shows a circuit diagram of NMOS and PMOS transistor.

Hereinafter detailed description will be described around the embodiment of transistors using NMOS or PMOS elements. FIG. 2 shows a circuit diagram of NMOS and PMOS transistors.

NMOS or PMOS transistor describing here comprises first, second and third terminals, respectively, like the FIG. 2, and is controlled the current flowing from first terminal to second terminal in proportion to the voltage applied to the third terminal. However, quantity of current become large as the voltage inputted to the third terminal becomes rising to the plus in the case of NMOS transistor. And quantity of current become large as the voltage inputted to the third terminal becomes dropping to the minus in the case of PMOS transistor. Generally, the first terminal is called to drain, the second terminal is called to source, and the third terminal is called to gate in NMOS. And the first terminal is called to source, the second terminal is called to drain, and the third terminal is called to gate in PMOS. But, the first is not definitely distinguished with the second terminal in PMOS and NMOS transistor, and it may be possible not to distinguish with each other. The scope of the present invention is not intended to limit the scope of NMOS and PMOS transistors, it may be applied to any element showed the equivalent characteristics of above NMOS and PMOS transistors.

Figure 3:
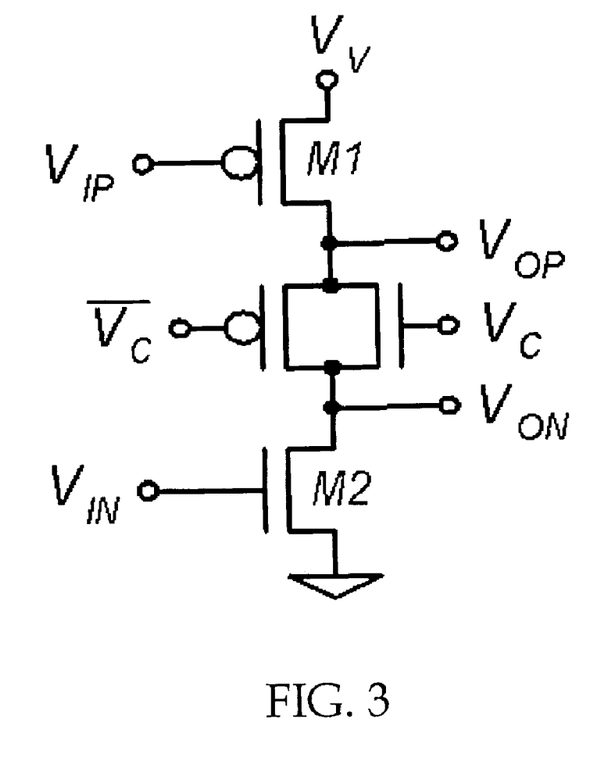
FIG. 3 shows a circuit diagram of single ended delay cell for describing the operation of self-regulating voltage controlled oscillator in accordance with the present invention.

FIG. 3 shows a circuit diagram of single ended delay cell for describing the operation of self-regulating voltage controlled oscillator in accordance with the present invention.

The single ended delay cell may control the delay of the cell by the resistor of transmission gate. That is, the delay of the cell is occurred in principle to the difference of reaching time between $V_{OP}$ with $V_{ON}$, but the difference of signal reaching time is controlled by the variable resistor of CMOS transmission gate. More particularly describing, the delay of the cell is determined by slew rate that signal is passed through the CMOS transmission gate, and the delay of the cell may be controlled by applying overdrive voltage of the transmission gate, because slew rate is given in the ratio of current which can be continued between parasitic capacitance and transmission gate.

Figure 4:
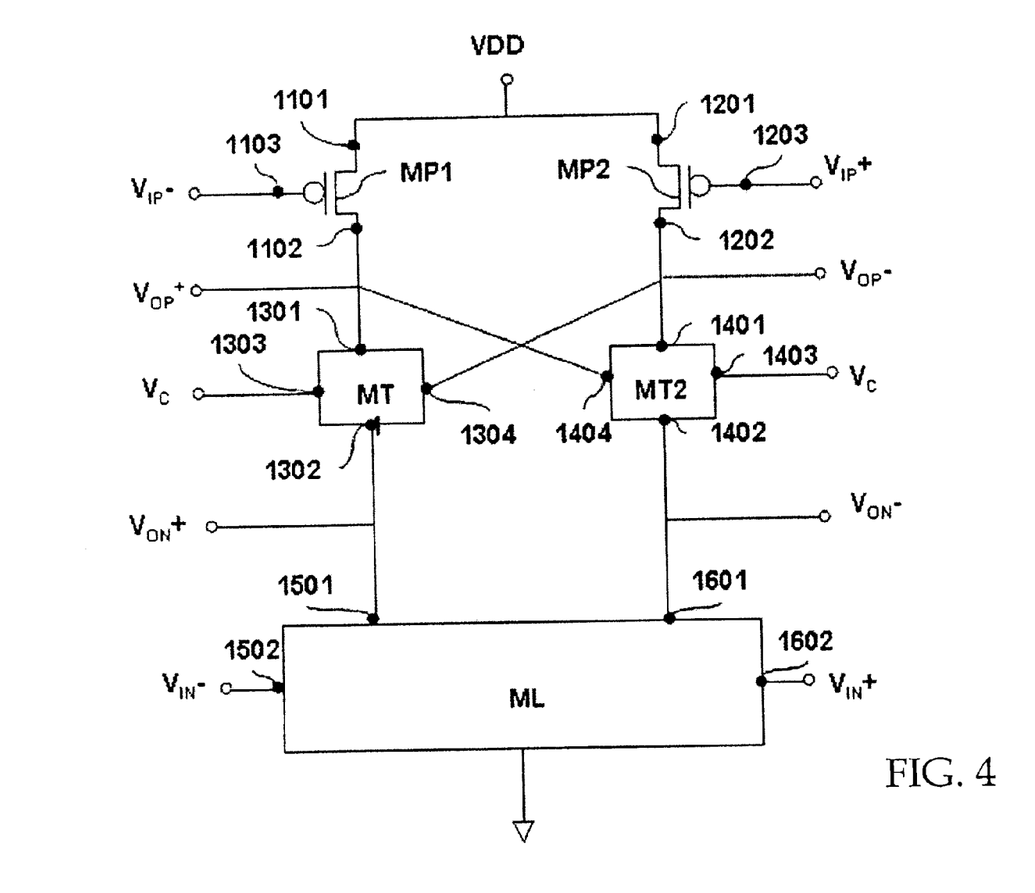
FIG. 4 shows a circuit diagram illustrating a delay cell of a self-regulating voltage controlled oscillator in accordance with an embodiment of the present invention.

FIG. 4 shows a circuit diagram illustrating a delay cell of a self-regulating voltage controlled oscillator in accordance with an embodiment of the present invention.

The delay cell of a self-regulating voltage controlled oscillator in accordance with an embodiment of the present invention comprises first and second PMOS transistor MP1 MP2, first and second transmission gate MT1 MT2 and latch ML as showed FIG. 4. Each of first and second PMOS transistors MP1 MP2 comprises first terminals 1101 1201, second terminals 1102 1202 and third terminals 1103 1203. The detail operations are as stated above. Each of the first and second transmission gates MT1 MT2 comprises input terminals 1301 1401, output terminals 1302 1402, first control terminals 1303 1403 and second control terminals 1304 1404. And the transmission gates MT1 MT2 transmit the signal of input terminals 1301 1401 to the output terminals 1302 1402 responding to the input of delay controlling signal in the first control terminals 1303 1403 and second control terminals 1304 1404. The latch ML comprises first and second input terminals 1502 1602, and first and second output terminals 1501 1601. And the latch ML outputs to the first and second output terminals 1501 1601, which have predetermined delay time when mutually inversion signals are inputted to the first and second input terminals 1502 1602.

Hereinafter, describing the connecting relations. First terminals 1101 1201 of the first and second PMOS transistors MP1 MP2 are connected with power source VDD. Each of the input terminals 1301 1401 of the first and second transmission gates MT1 MT2 is connected, respectively, with second terminals 1102 1202 of the first and second PMOS transistors, and each of the second control terminals 1304 1404 is connected, respectively, to the other input terminals 1401 1301 by crossing with each other. That is, any one of the second control terminals 1304 1404 between first and second transmission gates MT1 MT2 is connected to the rest one of input terminals 1401 1301. Each of the first and second output terminals 1501 1601 of latch ML is connected, respectively, to the output terminals 1302 1402 of the first and second transmission gates MT1 MT2.

Third terminals 1103 1203 of first and second PMOS transistors MP1 MP2 are respectively connected to the −input terminal $V_{IP}$− and the +input terminal $V_{IP}$+ of P type. A connecting point of second terminal 1102 in first PMOS transistor MP1 and input terminal 1301 in first transmission gate MT1 are connected to the +output terminal $V_{OP}$+ of P type, and a connecting point of second terminal 1202 in second PMOS transistor MP2 and input terminal 1401 in second transmission gate MT2 are connected to the −output terminal $V_{OP}$− of P type. First control terminals 1303 1403 of the first and second transmission gates MT1 MT2 are respectively connected to a control input $V_C$, and second control terminals 1304 1404 are respectively connected to the other input terminals 1401 1301 by crossing with each other. The output terminal 1302 of the first transmission gate MT1 and a connecting point of the first output terminal 1501 in the latch ML, and the output terminal 1402 of the second transmission gate MT2 and a connecting point of the second output terminal 1601 in the latch ML are respectively connected with +output terminal $V_{ON}$+ and −output terminal $V_{ON}$− of N type. Each of the first and second input terminals 1502 1602 of the latch ML is respectively connected to −input terminal $V_{IN}$− and +input terminal $V_{IN}$+ of N type.

Figure 5:
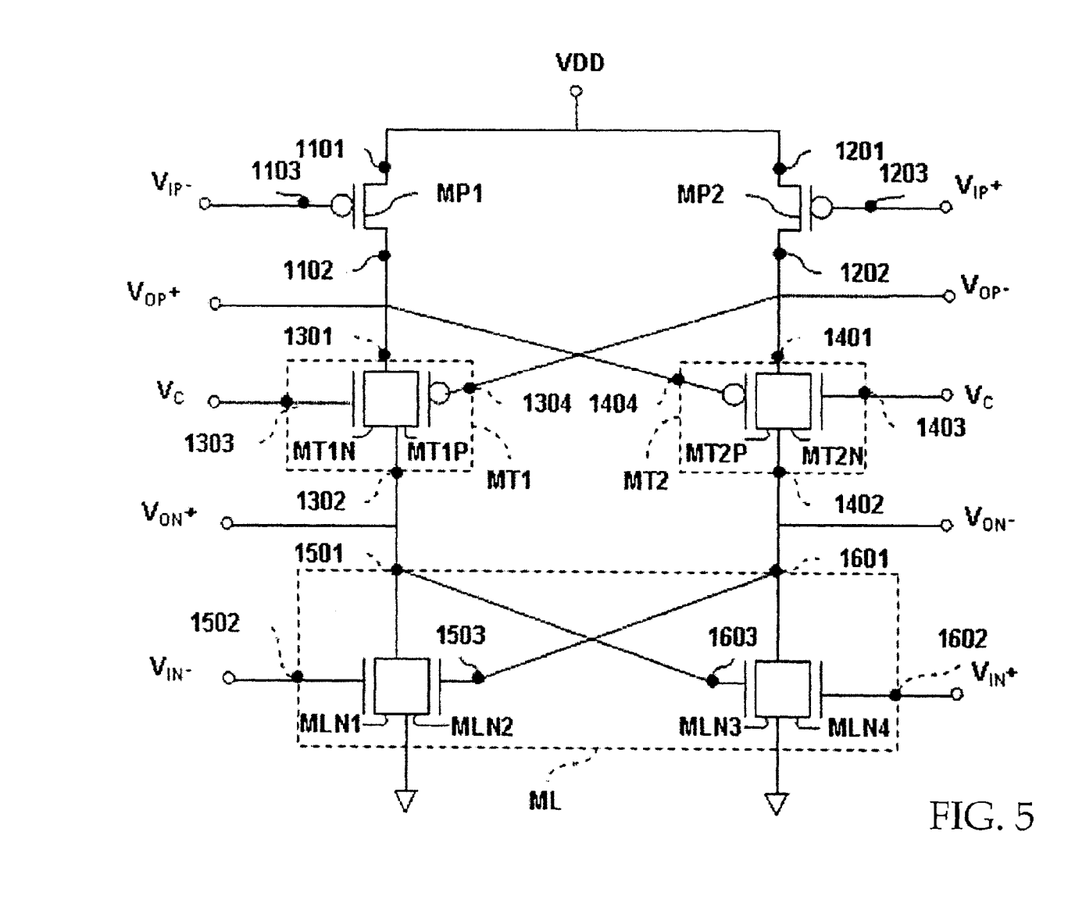
FIG. 5 shows a circuit diagram of implementing the circuit showed FIG. 4 using real NMOS and PMOS elements according to the embodiment of the present invention.

FIG. 5 shows a circuit diagram of implementing the circuit showed FIG. 4 using real NMOS and PMOS elements according to the embodiments of the present invention.

The first transmission gate MT1 comprises NMOS transistor and PMOS transistor, as showing FIG. 5. First terminal of the NMOS transistor connected with second terminal of the PMOS transistor forms an input terminal 1301, and second terminal of the NMOS transistor connected with first terminal of the PMOS transistor forms an output terminal 1302. Also, the third terminal of NMOS transistor MT1N and PMOS transistor MT1P comprised the first transmission gate MT1 respectively form first control terminal 1303 and second control terminal 1304 of the first transmission gate MT1.

Also, the second transmission gate MT2 comprises NMOS transistor MT2N and PMOS transistor MT2P. First terminal of the NMOS transistor MT2N connected with second terminal of the PMOS transistor MT2P forms an input terminal 1401, and second terminal of the NMOS transistor MT2N connected with first terminal of the PMOS transistor MT2P forms an output terminal 1402. Also, the third terminal of NMOS transistor MT2N and PMOS transistor MT2P comprised the second transmission gate MT2 respectively form first control terminal 1403 and second control terminal 1404 of the second transmission gate MT2.

Latch ML comprises a pair of first NMOS transistors and a pair of second NMOS transistors. A pair of first NMOS transistors comprises the first and second NMOS transistors MLN1 MLN2, and the first and second terminals of the first NMOS transistor MLN1, respectively, connected with the first and second terminals of the second NMOS transistor MLN2 form parallel architecture. A pair of second NMOS transistors comprises the third and fourth NMOS transistors MLN3 MLN4, and the first and second terminals of third NMOS transistor MLN3, respectively, connected with the first and second terminals of fourth NMOS transistor MLN4 form parallel architecture. First NMOS transistor MLN1 of a pair of first NMOS transistors connected with first terminal of the second NMOS transistor MLN2 form first output terminal 1501 of the latch ML, and third NMOS transistor MLN3 of a pair of second NMOS transistors connected with first terminal of the fourth NMOS transistor MLN4 form second output terminal 1601 of the latch ML. Third terminal of the first NMOS transistor MLN1 forms first input terminal 1502 and third terminal of the fourth NMOS transistor MLN4 forms second input terminal 1602. And, third terminal of the second NMOS transistor MLN2 and third terminal of the third NMOS transistor MLN3 is connected to second output terminal 1601 and first output terminal 1501 of the latch ML with mutually intersection.

The third terminal of a pair of first NMOS transistors and second NMOS transistors is grounded.

Hereinafter describing an operation of self-regulating voltage controlled oscillator according to an embodiment of the present invention, referring to FIG. 5.

According to the present invention, latch ML supports differential operation of self-regulating delay cell. And the latch ML rejects common-mode variations.

Also, for additional common-mode variations rejection, the second control input terminal 1304 of the first transmission gate MT1 and 1404 of the second transmission gate MT2 are cross-connected to the input terminals 1401 and 1301. That is, third terminal of the PMOS transistor MT1P in first transmission gate MT1 senses the slew rate changing occurred in −output terminal $V_{OP}$− of P-type through the input terminal 1401 of second transmission gate, and then controls the resistance of the first transmission gate MT1. Similarly, third terminal of the PMOS transistor MT2P in second transmission gate MT2 senses the slew rate changing occurred in $V_{OP}$+ through the input terminal 1301 of first transmission gate, and then controls the resistance of the second transmission gate MT2.

When the slew rate of $V_{OP}$+ goes higher due to increase in supply voltage, the resistance of PMOS transistor MP2P of the second transmission gate MT2 increases quickly and thus $V_{OP}$− is delayed. The $V_{OP}$− delayed by this operation is fed to the PMOS transistor MT1P of the first transmission gate MT1, lowering the slew rate of $V_{OP}$+. After all, this feedback is more delayed the $V_{OP}$+ than the nominal supply voltage.

According to the self-regulating operations of supply voltage like above, this self-regulating for supply voltage is more suitable for low phase noise design than using active regulators, because it is active only during transition of signal.

Figure 6:
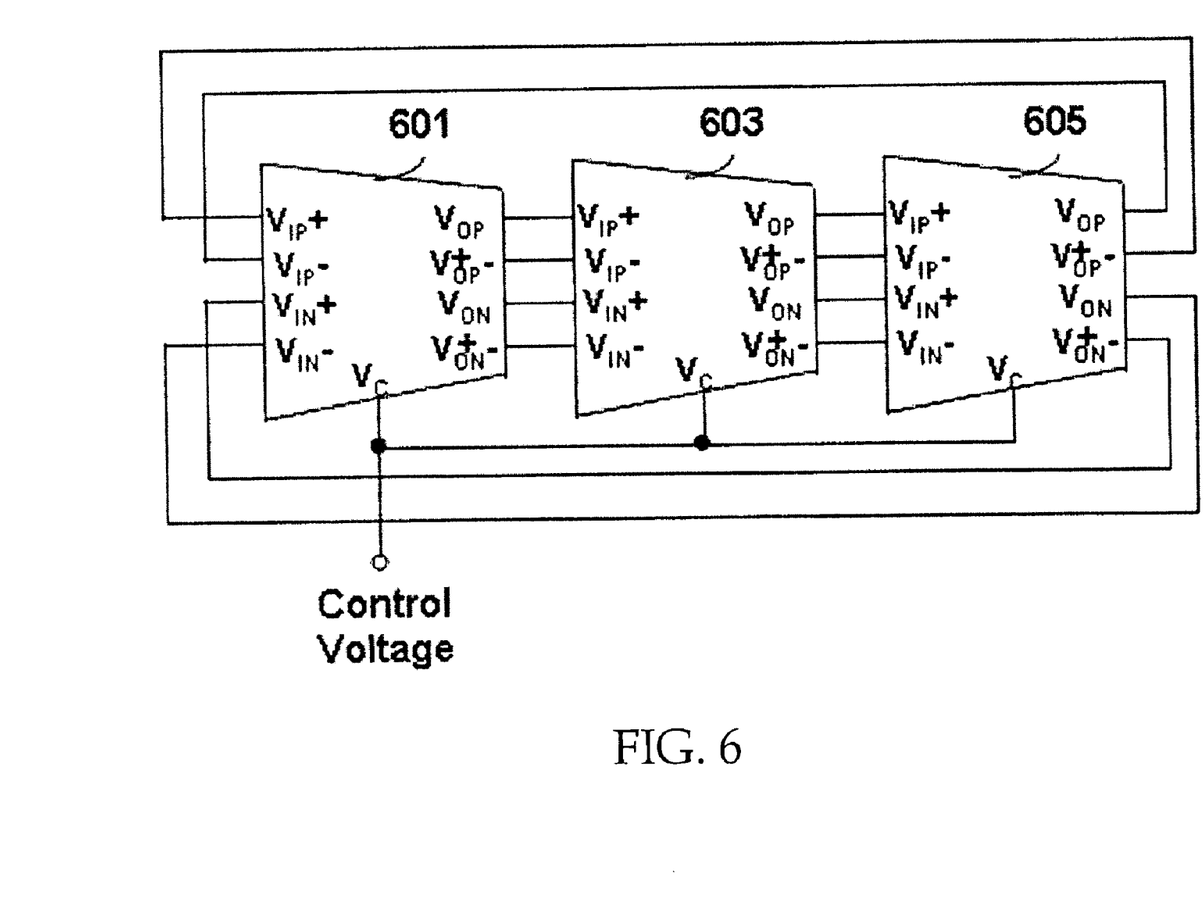
FIG. 6 shows a circuit diagram of a self-regulating voltage controlled oscillator embodied in three stage rings using a delay cell in accordance with FIG. 4 and FIG. 5 according to the present invention.

FIG. 6 shows a circuit diagram of a self-regulating voltage controlled oscillator embodied in three stage rings using delay cells in accordance with FIG. 4 and FIG. 5 according to the present invention. Self-regulating voltage controlled oscillators are composed to the serial connection among first delay cell 601, second delay cell 603 and third delay cell 605.

The first delay cell 601 outputs supply voltage or ground voltage according to the status of input electric potential. The output of the first delay cell 601 is inputted to second delay cell 603, which is serially connected with the output terminal of the first delay cell 601. The second delay cell 603 outputs the voltage reversed to the input signal. The output of the second delay cell 603 is inverted by the third delay cell 605, and then applies to the input terminal of the first delay cell 601. When three delay cells are connected in series to have ring type connection, then a clock signal having uniform frequency may be acquired from an output of one of the delay cells. The frequency of the clock signal may be adjusted by changing the control voltage.

To characterize the embedded self-regulating voltage controlled oscillator, a charge-pump PLL is designed for clock multiplication.

Figure 7:
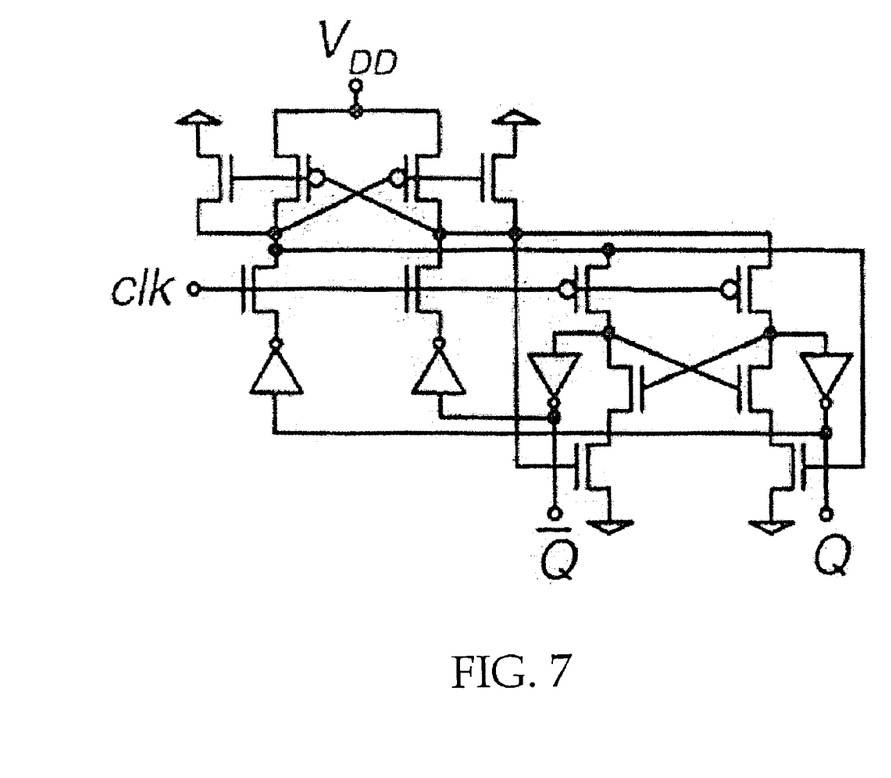
FIG. 7 shows a circuit diagram of the toggle Flip-Flop for dividing the voltage controlled oscillator output by a factor of 2, according to the present invention.

FIG. 7 shows the toggle flip-flop used to divide self-regulating voltage controlled oscillators output by a factor of 2. The flip-flop showed FIG. 7 is required to have equal rising and falling delay time in its output to guarantee 50% duty cycle. The flip-flop makes the slave latch floating in its active phase and thus prevents level contention at the output. With above characteristics, the flip-flop exhibits 2% simulated delay mismatch.

The prototype chip including SR-VCO and charge-pump PLL for clock generation is fabricated in 0.35 m CMOS. Below all the measurements are at 3.3V supply.

Figure 8:
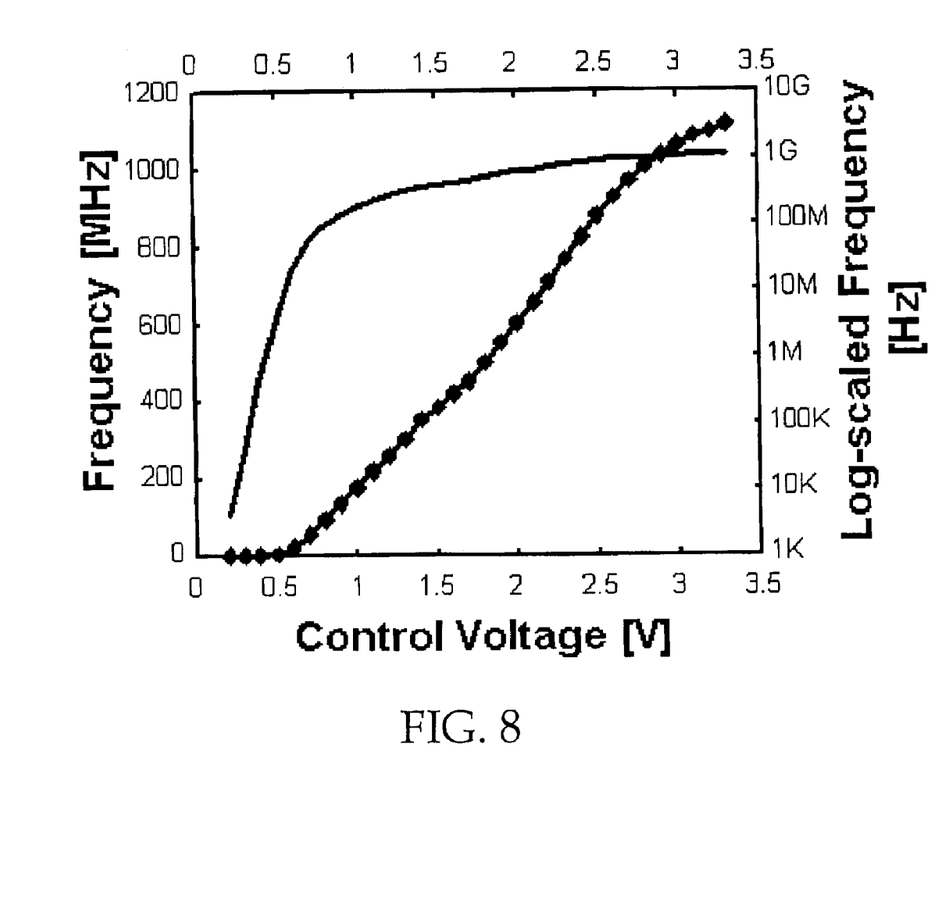
FIG. 8 shows a wave form diagram illustrating the tuning range of a self-regulating voltage controlled oscillator according to the present invention.

FIG. 8 shows a wave form diagram illustrating the tuning range of a self-regulating voltage controlled oscillator (SR-VCO) according to the present invention. The SR-VCO exhibits a 4 kHz to 1.1 kHz tuning range due to conduction of the transmission gate even in sub-threshold region. It is observed from the log-scaled plot that the tuning property depends on current-voltage characteristics of the transmission gate.

Figure 9:
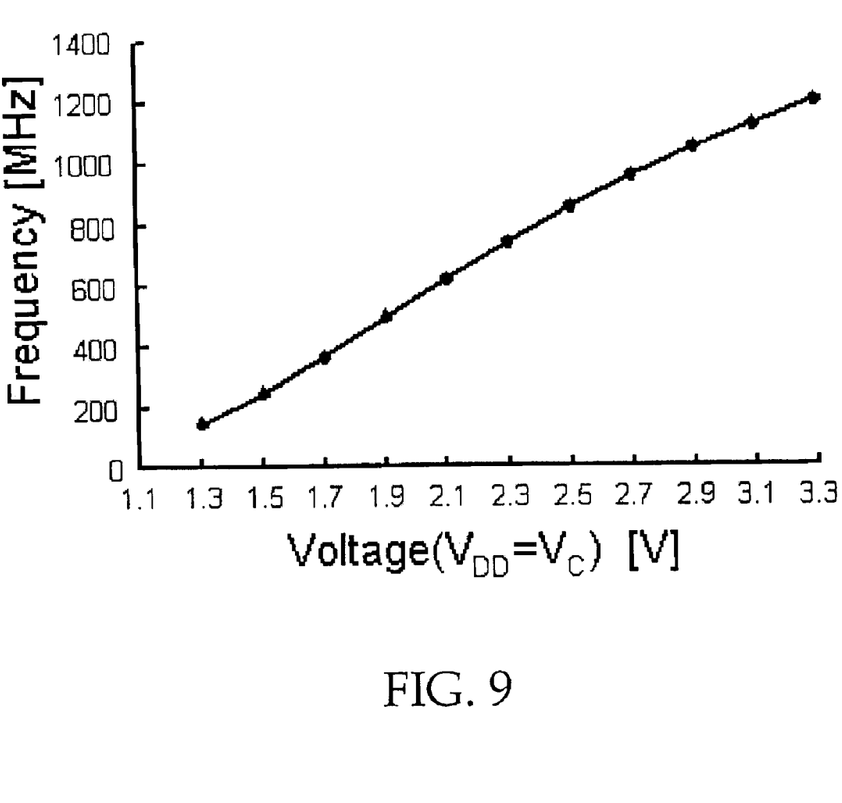
FIG. 9 shows a wave form diagram illustrating frequency measurement according to the increase of $V_{DD}$ when $V_C$ is setting to the same value with $V_{DD}$.

FIG. 9 shows a wave form diagram illustrating frequency measurement according to the increase of $V_{DD}$ when $V_C$ is setting to the same value with $V_{DD}$. The lowest frequency is observed at 147.6 MHz for minimum supply voltage of 1.3V, which approximately corresponds to the sum of the zero-biased threshold voltage of NMOS and PMOS transistor. Power consumption of the SR-VCO oscillating at 900 MHz is 10 mW.

Figure 10:
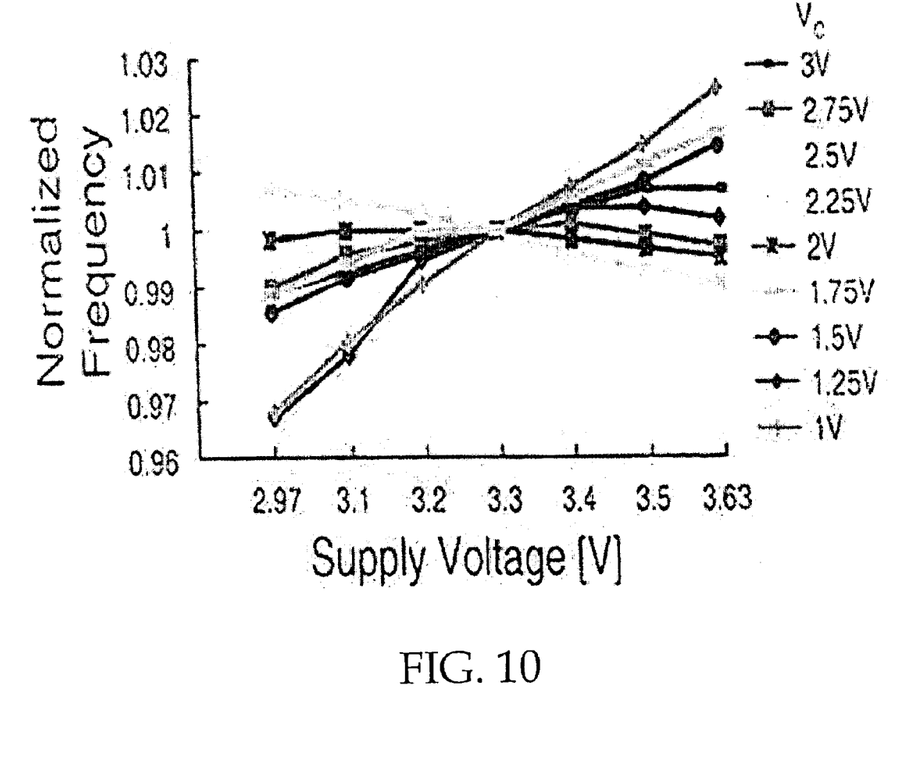
FIG. 10 shows a wave form diagram illustrating the sensitivity to the DC power source.

FIG. 10 shows a wave form diagram illustrating the sensitivity to the DC power source. While the supply voltage is varied 10% around nominal 3.3V, the resultant frequency is measured for each $V_C$ setting. In the range of $V_C$ from 1.5V to 3V, which corresponds to the frequency range from 398 MHz to 1.1 GHz, deviation is within ±1.45%. As $V_C$ is lowered to 1V, the frequency deviation increases to 3.6% at worst. The noise performance of the VCO itself can be evaluated from single-sideband (SSB) spectral phase noise.

Figure 11:
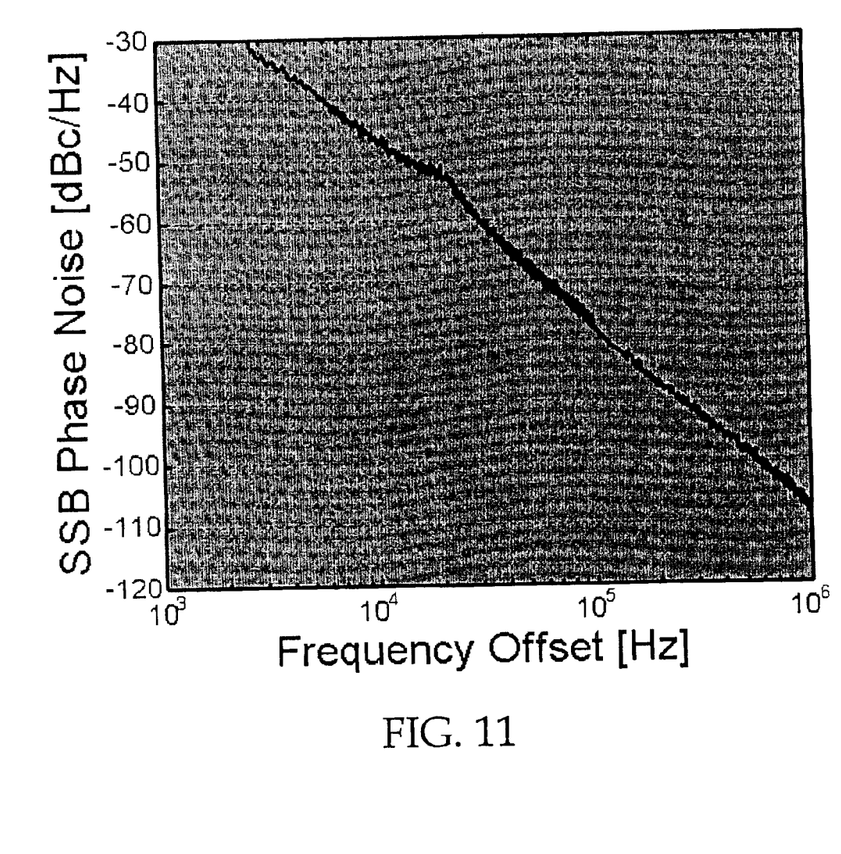
FIG. 11 shows a wave form diagram that the free-running voltage controlled oscillator at 900 MHz achieves 101.4 dBc/Hz at 600 MHz offset from the carrier.

FIG. 11 shows a wave form diagram that the free-running voltage controlled oscillator at 900 MHz achieves 101.4 dBc/Hz at 600 MHz offset from the carrier. Using multi-stage buffers on chip to drive the pad buffer and sharing power supply with that of the VCO may degrade the figure.

Figure 12:
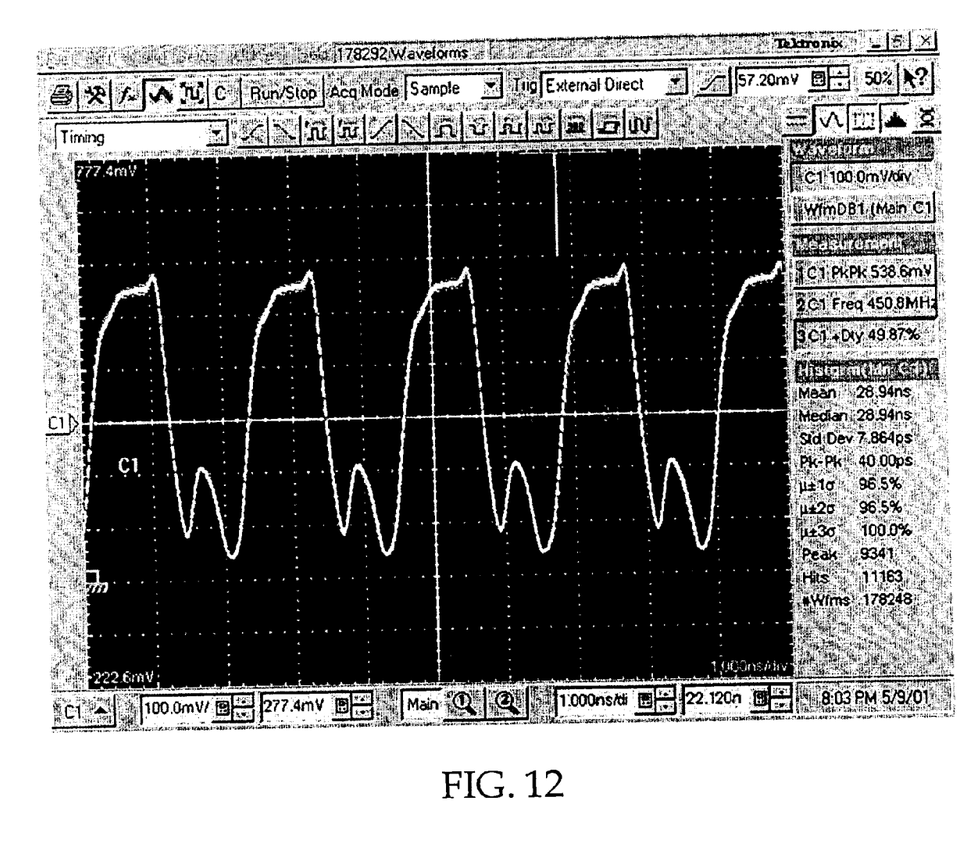
FIG. 12 shows a wave form diagram illustrating output clock when the PLL locks at 900 MHz.

FIG. 12 shows a wave form diagram illustrating output clock when the PLL locks at 900 MHz. Since the output clock is divided by a factor of two for duty cycle correction, its frequency is 450 MHz and power consumption is 28 mW. After 13 cycles from the triggering point, measured peak to peak and the RMS jitter are 40 ps and 7.86 ps, respectively. With the toggle flip-flop, output clock duty cycle is 49.87%.

INDUSTRIAL APPLICABILITY

In accordance with the present invention, a self-regulating voltage controlled oscillator is improved for the noise characteristics of power source voltage.

And using the resistance of transmission gate instead of tail current source, it is possible to control the delay of VCO.

Moreover, it is possible to self-regulating by composing a feedback in VCO.

Although the present invention has been described by way of exemplary embodiments, it should be understood that those skilled in the art might make many changes and substitutions without departing from the spirit and the scope of the present invention which is defined only by the appended claims.

What is claimed is:

1. A self-regulating voltage controlled oscillator using second type transistor which has first, second and third terminals, wherein current flowing from said first terminal to said second terminal is in proportion to voltage between the first and third terminals, comprising:

(a) first and second transistors of the second type, wherein the first terminals are connected to each other;

(b) first and second transmission gate, each having an input, first and second control, and output terminals, respectively, wherein each of the input terminals is connected to each of the second terminals of said first and second transistors, respectively, and each of the second control and input terminals of the first transmission gate is connected to each of the input and second terminals of the second transmission gate; and (c) a latch having first and second output terminals, each of which is connected to each of output terminals of said first and second transmission gates, respectively, and first and second input terminals.

2. A self-regulating voltage controlled oscillator of claim 1 further using first type transistor which has first second and third terminals, wherein current flowing from the second terminal to the first terminal is in proportion to voltage between the second and third terminals, wherein each of said first and second transmission gates comprises first and second type transistors, the first terminal of the first type transistor and the second terminal of the second type transistor is connected to each other to form the input terminal of the transmission gates, the second terminal of the first type transistor and the first terminal of the second type transistor is connected to each other to form the output terminal of the transmission gates, the third terminal of the first type transistor forms the first control terminal, and the third terminal of the second type transistor forms the second control terminal.

3. A self-regulating voltage controlled oscillator of claim 1, wherein said latch comprises:

first and second transistors of the first type which are connected to each other in parallel, such that, the first terminals of the first and second transistors are connected to each other to form the first output terminal, the second terminals of the first and second transistors are connected to each other, and the third terminal of the first transistor forms the first control terminal of said latch, third and fourth transistors of the first type which are connected to each other in parallel, such that, the first terminals of the third and fourth transistors are connected to each other to form the second output terminal, the second terminals of the third and fourth transistors are connected to each other, and the third terminal of the fourth transistor forms the second control terminal of said latch, and the third terminal of the second transistor is connected to the connection of the first terminal of the third and fourth transistors, and the third terminal of the third transistor is connected to the connection of the first terminals of the first and second transistors.

* * * * *